(12) United States Patent
Sugawara

(10) Patent No.: US 9,655,234 B2
(45) Date of Patent: May 16, 2017

(54) PLANAR ILLUMINATION DEVICE

(71) Applicant: MINEBEA CO., LTD., Kitasaku-gun, Nagano (JP)

(72) Inventor: Satoshi Sugawara, Fukuroi (JP)

(73) Assignee: MINEBEA CO., LTD., Nagano (JP)

( * ) Notice: Subject to any disclaimer, the term of this patent is extended or adjusted under 35 U.S.C. 154(b) by 43 days.

(21) Appl. No.: 14/944,949

(22) Filed: Nov. 18, 2015

(65) Prior Publication Data
US 2016/0150640 A1 May 26, 2016

(30) Foreign Application Priority Data
Nov. 25, 2014 (JP) .................. 2014-237800

(51) Int. Cl.
*F21V 7/04* (2006.01)
*H05K 1/02* (2006.01)
*F21V 8/00* (2006.01)
*H05K 1/18* (2006.01)

(52) U.S. Cl.
CPC ......... *H05K 1/0274* (2013.01); *G02B 6/0073* (2013.01); *H05K 1/189* (2013.01); *H05K 2201/0112* (2013.01); *H05K 2201/10106* (2013.01)

(58) Field of Classification Search
CPC .............. H05K 1/0274; H05K 1/189; H05K 2201/0112; H05K 2201/10106; G02B 6/0073
USPC .......... 362/611, 612, 613, 630, 631
See application file for complete search history.

(56) References Cited

U.S. PATENT DOCUMENTS

| 9,158,056 B2 * | 10/2015 | Takada | G02B 6/0068 |
| 2003/0223218 A1 * | 12/2003 | Kawakami | G02B 6/0016 362/612 |
| 2007/0279944 A1 * | 12/2007 | Sakai | G02B 6/0031 362/633 |
| 2008/0170174 A1 * | 7/2008 | Nishiyama | G02B 6/0073 349/62 |
| 2009/0237592 A1 * | 9/2009 | Mizutani | G02B 6/0021 349/62 |
| 2011/0103061 A1 * | 5/2011 | Kim | F21K 9/00 362/249.02 |

(Continued)

FOREIGN PATENT DOCUMENTS

| JP | 2013-131444 A | 7/2013 |
| JP | 2014-164995 A | 9/2014 |

*Primary Examiner* — Andrew Coughlin
*Assistant Examiner* — Glenn Zimmerman
(74) *Attorney, Agent, or Firm* — Oliff PLC

(57) ABSTRACT

A planar illumination device includes: a light guide plate; a point light source disposed to face a light incident surface of the light guide plate; and a circuit substrate on which the point light source is mounted. The circuit substrate includes: a base film; a first conductive layer and a first coverlay film stacked in sequence on a first surface of the base film, the first conductive layer including a pair of lands to which a pair of electrode terminals of the point light source are electrically connected; and a second conductive layer and a second coverlay film stacked in sequence on a second surface of the base film the second coverlay film including a light absorber. The second coverlay film is exposed between the lands and in front of a light emitting surface of the point light source in a light emitting direction.

8 Claims, 3 Drawing Sheets

(56) References Cited

U.S. PATENT DOCUMENTS

| | | | |
|---|---|---|---|
| 2013/0070476 A1* | 3/2013 | Kunimochi | G02B 6/0083 |
| | | | 362/606 |
| 2013/0163282 A1* | 6/2013 | Kunimochi | G02B 6/0011 |
| | | | 362/611 |
| 2014/0036541 A1* | 2/2014 | Takada | G02B 6/0068 |
| | | | 362/613 |
| 2014/0241009 A1 | 8/2014 | Kunimochi | |
| 2015/0219824 A1* | 8/2015 | Kunimochi | G02B 6/0031 |
| | | | 362/609 |
| 2016/0286646 A1* | 9/2016 | Horikawa | F21V 21/00 |

\* cited by examiner

PLANAR ILLUMINATION DEVICE

CROSS-REFERENCE TO RELATED APPLICATION(S)

The present application claims priority to and incorporates by reference the entire contents of Japanese Patent Application No. 2014-237800 filed in Japan on Nov. 25, 2014.

BACKGROUND OF THE INVENTION

1. Field of the Invention

The present invention relates to a planar illumination device.

2. Description of the Related Art

Today, liquid crystal display apparatuses used in combination with planar illumination devices enjoy a widespread use as display devices for personal computers, cellular phones, and other electronic apparatuses because of their advantage of ease of reduction in thickness. With the recent increasing trend toward greater performance offered by white light emitting diodes (LEDs), planar illumination devices incorporating white LEDs as light sources are becoming more common, which represents industry's efforts toward achieving even further reduction in size and thickness and even lower power consumption of the planar illumination devices. Such a planar illumination device includes, a light guide plate having a pair of principal surfaces opposed to each other, in which one of the principal surfaces serves as a light emitting surface, a LED disposed to face a light incident surface of the light guide plate, and a circuit substrate on which the LED is mounted. A white LED 100 illustrated in FIG. 3, for example, is used as the LED (see, for example, Japanese Patent Application Laid-open No. 2014-164995). The white LED 100 includes a blue LED chip 102 encapsulated by a yellow phosphor 104 in a lamp house 106 formed of a white resin. As illustrated in FIG. 3, the blue LED chip 102 is disposed at a substantially central portion in a longitudinal direction of the lamp house 106. Additionally, an electrode terminal (not illustrated) is disposed at each of both ends in the longitudinal direction of the lamp house 106. Flexible printed circuit boards (FPCs) are widely used as the circuit substrate on which the electrode terminals are mounted.

The FPC has a coverlay film that protects a conductor layer. A side-light type planar illumination device including a white coverlay film has been developed (see, for example, Japanese Patent Application Laid-open No. 2013-131444). The white coverlay film has a white reflective layer formed on an entire surface of a film substrate, functioning as a protective member and a light reflecting member. Specifically, even in a display device structure involving a gap between a light emitting surface of the LED and a light incident surface of the light guide plate, the white coverlay film blocks this gap to thereby reduce an amount of light that leaks from this gap to the outside, in which the light is emitted from the light emitting surface of the LED. Additionally, light reflected by the white coverlay film is incident upon the light guide plate through the light incident surface of the light guide plate, so that luminance of the light emitting surface of the light guide plate can be improved.

When the white LED 100 composed of the blue LED chip 102 and the yellow phosphor 104 as illustrated in FIG. 3 is used as a point light source of a planar illumination device, light rays L2 and L1 emitted in directions inclined with respect to an optical axis tend to be more tinged with yellow than with a light ray L3 emitted in a direction parallel with the optical axis. Moreover, the light L1 that is angled more greatly from the optical axis is more tinged with yellow than the light ray L2. This light being tinged is attributable to a distance over which the light emitted from the blue LED chip 102 travels before reaching a light emitting surface 100a, specifically, a light path through the yellow phosphor 104 being longer in the following order: L3<L2<L1. In addition, the light L1 and the light ray L2 that are inclined with respect to the optical axis are incident upon the light incident surface of the light guide plate and tend to be emitted from a region of the light emitting surface on a side closer to the light incident surface. Thus, when the white coverlay film is used for the coverlay film of the FPC, light emitted from the region of light emitting surface of the light guide plate on the side closer to the light incident surface of the light guide plate is tinged with yellow, sometimes resulting in uneven color being perceived.

Meanwhile, a need exists in the planar illumination device for a thinner configuration, in addition to a need for improved illumination performance; however, as the configuration becomes thinner, the uneven color tends to occur more conspicuously.

SUMMARY OF THE INVENTION

It is an object of the present invention to at least partially solve the problems in the conventional technology.

A planar illumination device may include: a light guide plate including a pair of principal surfaces opposed to each other, one of the principal surfaces serving as a light emitting surface; a point light source disposed to face a light incident surface of the light guide plate; and a circuit substrate on which the point light source is mounted. The circuit substrate may include: a base film including a first surface and a second surface; a first conductive layer and a first coverlay film stacked in sequence on the first surface of the base film, the first conductive layer including a pair of lands to which a pair of electrode terminals of the point light source are electrically connected; and a second conductive layer and a second coverlay film stacked in sequence on the second surface of the base film the second coverlay film including a light absorber. The second coverlay film may be exposed between the lands and in front of a light emitting surface of the point light source in a light emitting direction in a plan view of the circuit substrate as viewed from the first surface of the base film.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1A:
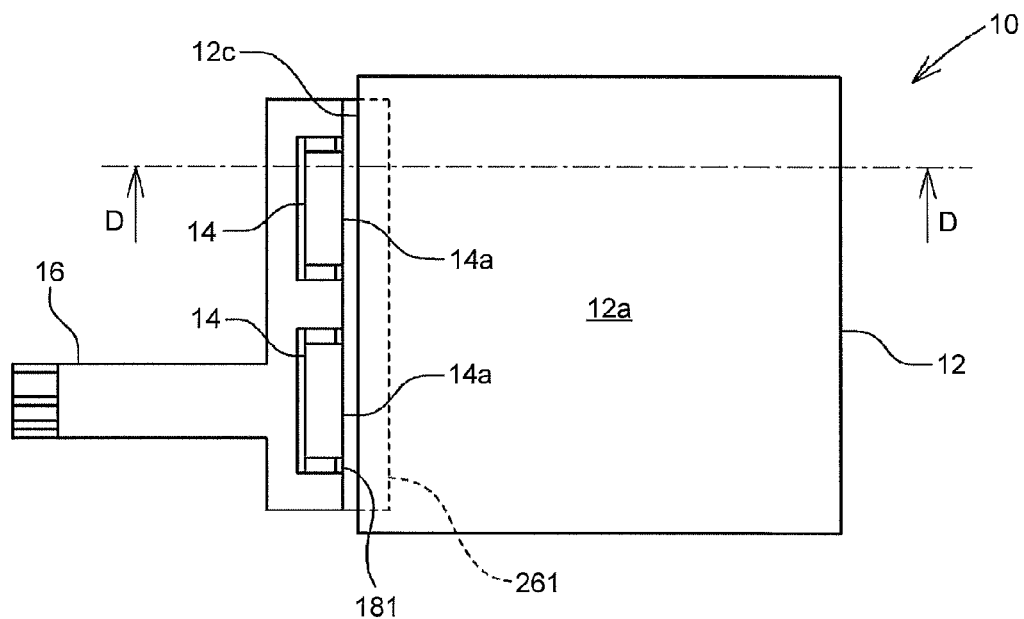
FIG. 1A is a schematic plan view illustrating a planar illumination device according to an embodiment of the present invention.

The following describes an embodiment of the present invention with reference to the accompanying drawings. In this following, the components identical to those in the related art or the corresponding components found in the related art are denoted by the same reference numerals and descriptions therefor will not be duplicated. Directional expressions of "upper" and "lower" in the following description are given with reference to a vertical direction when the planar illumination device being described is placed in a horizontally flat position. Directional expressions of "forward" or "front" and "rear" refer to "forward" or "front" in a direction in which light is emitted from a light emitting surface of a point light source and a direction opposite to the "forward" or "front" direction, respectively, when the planar illumination device being described is placed in the horizontally flat position. An expression of "substantially aligned" includes, in addition to a condition of being completely aligned, a condition of being aligned permitting errors involved in dimensional accuracy and assembly accuracy.

Figure 1B:
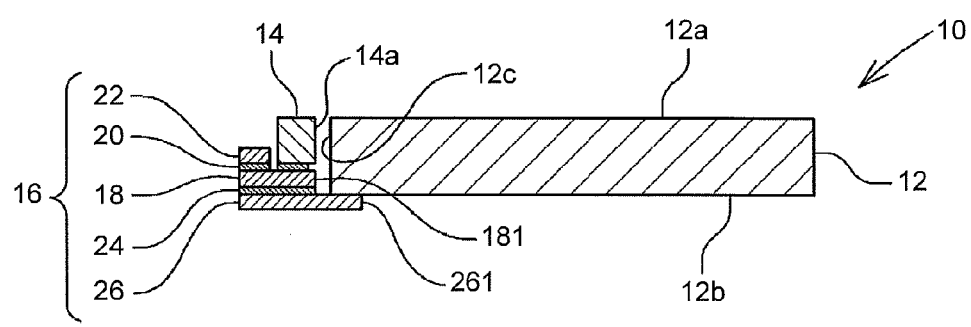
FIG. 1B is a schematic sectional view taken along line D-D in FIG. 1A illustrating the planar illumination device.
Figure 2A:
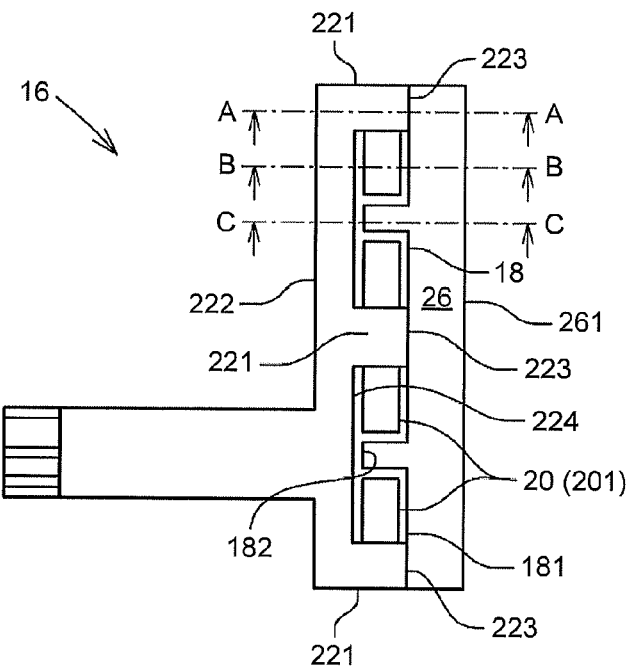
FIG. 2A is a schematic plan view illustrating a circuit substrate of the planar illumination device illustrated in FIGS. 1A and 1B.
Figure 2B:
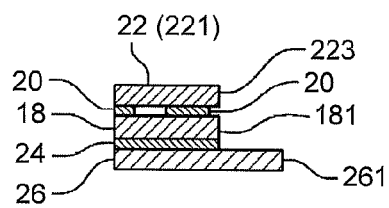
FIG. 2B is a schematic sectional view taken along line A-A in FIG. 2A illustrating the circuit substrate.
Figure 2C:
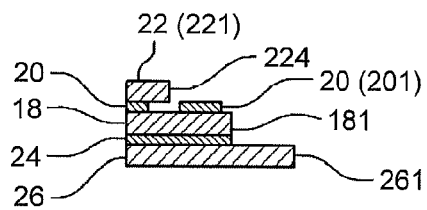
FIG. 2C is a schematic sectional view taken along line B-B in FIG. 2A illustrating the circuit substrate.
Figure 2D:
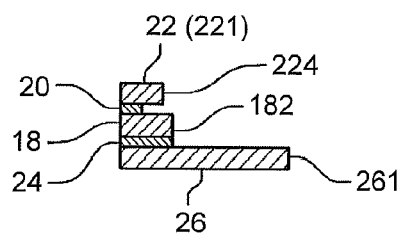
FIG. 2D is a schematic sectional view taken along line C-C in FIG. 2A illustrating the circuit substrate.

This planar illumination device 10 illustrated in FIGS. 1A and 1B includes a light guide plate 12, LEDs as point light sources 14, and a circuit substrate 16. The light guide plate 12 has a pair of principal surfaces 12a and 12b that are opposed to each other. The principal surface 12a, of the principal surfaces 12a and 12b, serves as a light emitting surface 12a. The point light sources 14 are disposed so as to face a light incident surface 12c of the light guide plate 12. The point light sources 14 are mounted on the circuit substrate 16. Optical sheets (not illustrated) including a diffusion sheet and a prism sheet are disposed above the light emitting surface 12a of the light guide plate 12. A reflection sheet (not illustrated) is disposed below the principal surface 12b opposed to the light emitting surface 12a. These elements are housed in a frame (not illustrated) formed of, for example, a synthetic resin or a metal to configure an integrated unit.

The light guide plate 12 has a flat rectangular shape. The light guide plate 12 exemplified in FIGS. 1A and 1B has a flat shape having the pair of mutually opposed principal surfaces 12a and 12b extending in parallel with each other. A different type of light guide plate may nonetheless be used. This type of light guide plate includes what is called a light incident wedge portion formed to extend over a range of a certain width from the light incident surface 12c, in which an end portion at which the light incident surface 12c is disposed has a width greater than a width of a range over which light is emitted from the light emitting surface 12a. The LEDs as the point light sources 14 each generally have a rectangular parallelepiped shape configured as what is called a sideview type white LED having a light emitting surface 14a defined on a side surface that extends orthogonally to a bottom surface on which an electrode terminal is disposed. Detailed internal arrangements of the point light source 14 are the same as those of the white LED 100 illustrated in FIG. 3 and detailed descriptions therefor will be omitted.

The circuit substrate 16 is what is called a double-sided FPC. As illustrated also in FIGS. 2A to 2D, the circuit substrate 16 has a laminate structure including a base film 18, a first conductive layer 20 and a first coverlay film 22 stacked in sequence on a first surface (a surface of a component side on which the point light source 14 is mounted) of the base film 18, and a second conductive layer 24 and a second coverlay film 26 stacked in sequence on a second surface (a reverse side of the first surface) of the base film 18. The base film 18 carries the first conductive layer 20 and the second conductive layer 24. The first coverlay film 22 and the second coverlay film 26 cover the first conductive layer 20 and the second conductive layer 24, respectively. Additionally, in the example illustrated in FIGS. 1A and 1B, the circuit substrate 16 is formed into a rectangle in a plan view so that the two point light sources 14 are juxtaposed to each other in a longitudinal direction thereof (in the vertical direction in FIG. 1A).

The first coverlay film 22 is formed substantially into a comb shape. Specifically, the first coverlay film 22 includes end portions 221 and a connecting portion 222. More specifically, the end portions 221 are disposed at both ends in the longitudinal direction of the point light source 14 in a plan view of the circuit substrate 16 as viewed from the first surface of the base film 18 (see FIG. 2A). The connecting portion 222 is disposed in rear of the point light source 14 to connect together the end portions 221. To state the foregoing differently, a front end portion of the first coverlay film 22, specifically, a front end portion of the end portion 221 has a front side surface 223 that is substantially aligned with the light emitting surface of the point light source 14. The front end portion of the end portion 221 further has a cutout 224 formed at a position that overlaps the point light source 14. The cutout 224 extends toward the rear from the front side surface 223, to thereby allow a pair of lands 201 of the first conductive layer 20 to be described later to be exposed.

The first conductive layer 20 includes the pair of lands 201 to which the pair of electrode terminals of the point light source 14 is electrically connected. The pair of lands 201 is exposed from the cutout 224 in the first coverlay film 22 in a condition of being linearly disposed in a plan view of the circuit substrate 16 as viewed from the first surface of the base film 18 (see FIG. 2A). In the plan view of the circuit substrate 16, the base film 18 has a front side surface 181 that is substantially aligned with the light emitting surface 14a of the point light source 14. The base film 18 further has a cutout 182 formed at a position that overlaps the point light source 14. The cutout 182 extends toward the rear from the front side surface 181. To state the foregoing differently, the base film 18 is disposed in portions excepting a portion anterior to the point light source 14 and a portion between the lands 201 of the first conductive layer 20. In addition, the front side surface 181 of, and the cutout 182 in, the base film 18 define an outline of the first conductive layer 20 stacked on the first surface of the base film 18. Thus, the first conductive layer 20, having a discontinuous outline following the front side surface 181 and the cutout 182, has formed therein the pair of lands 201 to which the pair of electrode terminals of the point light source 14 is electrically connected.

The second conductive layer 24 is configured to be patterned as appropriate according to a connection mode (e.g., quantity, layout, and positions of electrode terminals) of the point light source 14. The second conductive layer 24, while being stacked on the second surface of the base film 18, is electrically connected to the first conductive layer 20 stacked on the first surface of the base film 18 via a through hole (not illustrated) that passes through the base film 18 in a thickness direction.

The second coverlay film 26 is formed of a black member that absorbs all visible rays. The second coverlay film 26 is formed, in its plan view, into an outline shape substantially aligned with an outline of the circuit substrate 16 (see FIG. 2A). From a relation to the outlines of the base film 18 and the first coverlay film 22 described above, the second coverlay film 26 is exposed, in the plan view of the circuit substrate 16 as viewed from the first surface of the base film 18, in front of the light emitting surface 14a of the point light source 14 (see FIGS. 1A and 1B) in the light emitting direction and also is exposed between the lands 201.

FIGS. 1A and 1B illustrate a positional relation between the light incident surface 12c of the light guide plate 12 and a front side surface 261 of the second coverlay film 26. As is understood from FIGS. 1A and 1B, the second coverlay film 26 is disposed such that, in the plan view of the circuit substrate 16, the front portion of the second coverlay film 26 projecting from the light emitting surface 14a of the point light source 14 in the light emitting direction overlaps the principal surfaces 12a and 12b of the light guide plate 12. The second coverlay film 26 is bonded and fixed to the principal surface 12b of the light guide plate 12 in the overlapping portion between the portion of the second coverlay film 26 forward in the light emitting direction of the point light source 14 and the principal surfaces 12a and 12b of the light guide plate 12. It is noted that, although not illustrated, the number of point light sources 14 does not necessarily have to be two or more and the planar illumination device 10 may include only one point light source 14. Additionally, in FIGS. 1A and 1B, the circuit substrate 16 is illustrated as being disposed on the side of the principal surface 12b opposed to the light emitting surface 12a of the light guide plate 12. Nonetheless, the circuit substrate 16 may be disposed on the side of the light emitting surface 12a of the light guide plate 12.

The light ray (see reference numeral L3 in FIG. 3) emitted from the light emitting surface 14a of the point light source 14 in the optical axis direction (the direction perpendicular to the light emitting surface of the point light source) is incident upon the light incident surface 12c of the light guide plate 12. The light, as it travels through the light guide plate 12, goes through an optical path change as appropriate before being emitted from the light emitting surface 12a. Meanwhile, out of light rays (see reference numerals L1 and L2 in FIG. 3) emitted in directions inclined with respect to the optical axis direction from the light emitting surface 14a of the point light source 14, the rays that propagate to the portion forward in the emitting direction of light from the light emitting surface 14a of the point light source 14 and to the portion between the lands 201 in the plan view of the circuit substrate 16 as viewed from the first surface of the base film 18 (see FIGS. 1A and 2A) are absorbed by the second coverlay film 26 exposed in the corresponding portions of the circuit substrate 16. This absorption reduces a ratio of the light rays emitted from the light emitting surface 14a of the point light source 14 in the directions inclined with respect to the optical axis to the light rays incident upon the light incident surface 12c of the light guide plate 12. This reduction results in an increased ratio of the light rays emitted from the light emitting surface 14a of the point light source 14 in the optical axis direction to the light rays emitted from the light emitting surface 12a of the light guide plate 12.

Figure 3:
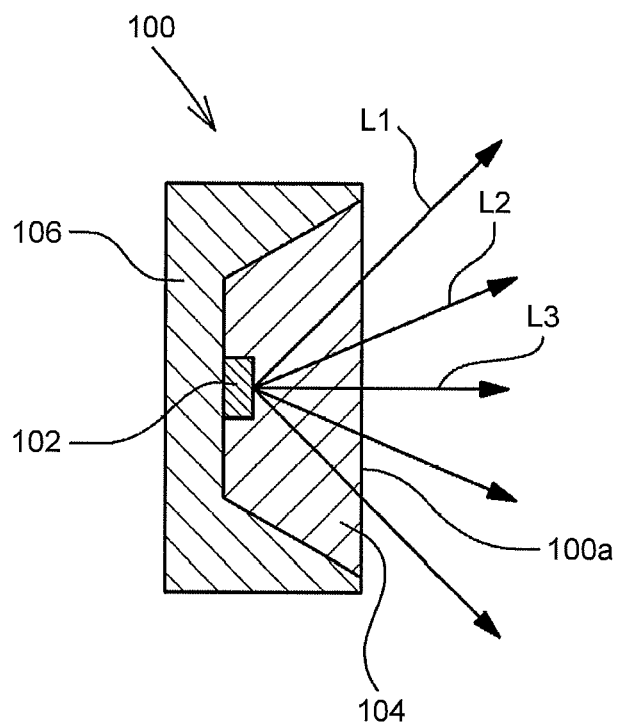
FIG. 3 is a schematic sectional view illustrating a white LED that includes a light emitting chip and a phosphor.

The point light source 14, because of its structure including the blue LED chip 102 and the yellow phosphor 104 in a manner similar to what is illustrated in FIG. 3, achieves an emission spectrum in which a mixed color of blue light of the blue LED chip 102 and yellow light emitted by the yellow phosphor 104 that absorbs the blue light looks white. The light emitted from the light emitting surface 14a of the point light source 14 in the directions inclined with respect to the optical axis tends to be more tinged with yellow at greater angles of inclination from the optical axis. At the same time, this light tends to be emitted from a region of the light emitting surface 12a of the light guide plate 12 closer to the light incident surface 12c. This light tinged with yellow is absorbed by the second coverlay film 26 formed of a black member and in the plan view of the circuit substrate 16 as viewed from the first surface side of the base film 18 exposed in the front portion in the light emitting direction of the point light source 14 and exposed between the lands 201. This absorption results in a reduced ratio of light rays (see reference numerals L1 and L2 in FIG. 3) tinged with yellow and emitted from the light emitting surface 14a of the point light source 14 in the directions inclined with respect to the optical axis to light rays incident upon the light incident surface 12c of the light guide plate 12. As a result, likelihood of occurrence of uneven color in the planar illumination device 10 can be reduced and reduction in thickness of the planar illumination device 10 can be further promoted.

As an applied example, the second coverlay film 26 may be formed of, instead of the black member that absorbs all visible rays, a member that exhibits a property of absorbing at least yellow light (the color of light emitted by the yellow phosphor 104 of the white LED 100 illustrated in FIG. 3 and constituting the point light source 14). An exemplary candidate is a blue coverlay film formed of a blue member that absorbs light rays other than blue light. In this case, the light rays emitted from the light emitting surface 14a of the point light source 14 in the directions inclined with respect to the optical axis, from which yellowishness is eliminated, are incident upon the light incident surface 12c of the light guide plate 12 to thereby be added to the light emitted from the light emitting surface 12a. As a result, the likelihood of occurrence of uneven color in the planar illumination device 10 can be reduced and improved luminance can be expected.

In the planar illumination device 10 according to the embodiment of the present invention, the second coverlay film 26 is disposed such that, in the plan view of the circuit substrate 16, the portion of the second coverlay film 26 forward in the light emitting direction of the point light source 14 overlaps the principal surfaces 12a and 12b of the light guide plate 12. As described earlier, the second coverlay film 26 is exposed in this portion in the plan view of the circuit substrate 16 as viewed from the first surface side of the base film 18. Specifically, no components of the multi-layer structure other than the second coverlay film 26 exist in the corresponding portion of the circuit substrate 16, so that the second coverlay film 26 directly overlaps the principal surfaces 12a and 12b of the light guide plate 12. As a result, the overlapping portion of the circuit substrate 16 and the light guide plate 12 has a thickness that falls within a thickness of the light guide plate 12 to which a thickness of the second coverlay film 26 is added (or to which a thickness of an adhesive layer of, for example, double-sided tape for fixing both is added). Thus, reduction in the thickness of the planar illumination device 10 can be even further promoted.

In the plan view of the circuit substrate 16, the base film 18 has the front side surface 181 that is substantially aligned with the light emitting surface 14a of the point light source 14. The base film 18 further has the cutout 182 formed at a position that overlaps the point light source 14, in which the cutout 182 extends toward the rear from the front side surface 181. Thus, the second coverlay film 26 stacked on the second surface of the base film 18 is exposed in portions further forward of the front side surface 181 and of the cutout 182. This configuration achieves the above-described effect. In other words, the front side surface 181 of, and the cutout 182 in, the base film 18 are covered in the second coverlay film 26 as viewed from the second surface side of the base film 18.

In the planar illumination device 10 according to the embodiment, the point light source 14, because of its structure including the light emitting chip and the phosphor, achieves an emission spectrum in which a mixed color of a color of light of the light emitting chip and a color of light emitted by the phosphor that absorbs the light of the light emitting chip looks a certain color. A specific example of this includes a white LED 100 that emits white light using blue light of the light emitting chip 102 mixed with yellow light of a yellow phosphor 104. With the white LED 100, as described earlier, the light emitted from the light emitting surface 14a of the point light source 14 in the directions inclined with respect to the optical axis tends to be more tinged with yellow at greater angles of inclination from the optical axis. At the same time, this light tends to be emitted from a region of the light emitting surface 12a of the light guide plate 12 closer to the light incident surface 12c. This light tinged with yellow is absorbed by the absorber that absorbs light emitted by the phosphor 104 and that forms the second coverlay film 26 exposed, in the plan view of the circuit substrate 16 as viewed from the first surface side of the base film 18, in the portion forward in the emitting direction of light from the light emitting surface 14a of the point light source 14 and the portion between the lands 201. This absorption results in a reduced ratio of light rays tinged with yellow and emitted from the light emitting surface 14a of the point light source 14 in directions inclined with respect to the optical axis to light rays incident upon the light incident surface 12c of the light guide plate 12.

Non-limiting examples of the absorber that forms the second coverlay film 26 and that absorbs light emitted by the phosphor include, for example, a material that absorbs light emitted by the phosphor and is mixed with a material of the second coverlay film 26, and a material that absorbs light emitted by the phosphor and is applied to the surface of the second coverlay film 26 formed of a colorless transparent or yellow translucent material. Additionally, for a second coverlay film 26 coated with a material that absorbs light emitted by the phosphor, the coating does not necessarily have to cover all areas forward of the point light source 14; for example, the coating may only be applied to the portion forward in the emitting direction of light from the light emitting surface 14a of the point light source 14 and the portion between the lands 201, specifically, of the surface of the second coverlay film 26, only the area on which the light emitted from the emitting surface 14a can fall.

The light emitted from the light emitting surface 14a of the point light source 14 in the directions inclined with respect to the optical axis is absorbed by the second coverlay film 26 through the black member in the portion forward in the emitting direction of light from the light emitting surface 14a of the point light source 14 and the portion between the lands 201 in the plan view of the circuit substrate 16 as viewed from the first surface of the base film 18. The black member may, for example, be mixed with a material of the second coverlay film 26 or applied as a coating to the surface of the second coverlay film 26 formed of a colorless transparent or yellow translucent material.

In the planar illumination device 10, the black member may be replaced with a blue member. As a result, light rays other than blue light are absorbed out of the light rays emitted from the light emitting surface 14a of the point light source 14 in the directions inclined with respect to the optical axis. As described in the above, when the white LED 100 including the light emitting chip 102 and the phosphor 104 is used in particular, the light tinged with yellow and emitted from the light emitting surface 14a in the directions inclined with respect to the optical axis is absorbed by the blue member of the second coverlay film 26.

The planar illumination device 10, in which, in a plan view of the circuit substrate 16 as viewed from the first surface of the base film 18, the first coverlay film 22 has a front side surface that is substantially aligned with the light emitting surface 14a of the point light source 14 and the cutout 224 formed at a position that overlaps the point light source 14, the cutout 224 extending toward a rear from the front side surface and for exposing the pair of lands 201 included in the first conductive layer 20. In the planar illumination device 10, the first coverlay film 22 has the front side surface that is substantially aligned with the light emitting surface 14a of the point light source 14 in the plan view of the circuit substrate as viewed from the first surface side of the base film 18 and, in the cutout 224 formed at a position overlapping the point light source 14 to extend toward the rear from the front side surface, the pair of lands 201 of the first conductive layer 20 is exposed. Thus, the point light source 14 has its electrode terminal connected electrically to the pair of lands 201 without interfering with the first coverlay film 22.

According to the embodiment of the present invention, it is possible to promote further reduction in thickness of the planar illumination device 10 and reduce the likelihood of occurrence of uneven color.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A planar illumination device comprising:
   a light guide plate including a pair of principal surfaces opposed to each other, one of the principal surfaces serving as a light emitting surface;
   a point light source disposed to face a light incident surface of the light guide plate; and
   a circuit substrate on which the point light source is mounted, the circuit substrate comprising:
   a base film including a first surface and a second surface;
   a first conductive layer and a first coverlay film stacked in sequence on the first surface of the base film, the first conductive layer including a pair of lands to which a pair of electrode terminals of the point light source are electrically connected; and
   a second conductive layer and a second coverlay film stacked in sequence on the second surface of the base film the second coverlay film including a light absorber,
   wherein the second coverlay film is exposed between the lands and in front of a light emitting surface of the point light source in a light emitting direction in a plan view of the circuit substrate as viewed from the first surface of the base film.

2. The planar illumination device according to claim 1, wherein
the point light source includes a light emitting chip and a phosphor, and
the light absorber absorbs at least light emitted by the phosphor.

3. The planar illumination device according to claim 2, wherein the second coverlay film includes a black member.

4. The planar illumination device according to claim 2, wherein the second coverlay film includes a blue member.

5. The planar illumination device according to claim 1, wherein the second coverlay film includes a black member.

6. The planar illumination device according to claim 1, wherein the second coverlay film includes a blue member.

7. The planar illumination device according to claim 1, wherein a front portion of the second coverlay film in the emitting direction of light from the point light source overlaps the principal surfaces of the light guide plate in a plan view of the circuit substrate.

8. The planar illumination device according to claim 1, wherein the base film includes:
a front side surface substantially aligned with the light emitting surface of the point light source in the plan view of the circuit substrate; and
a cutout formed at a position overlapping the point light source and extending toward a rear from the front side surface.

* * * * *